(12) United States Patent
Lin et al.

(10) Patent No.: US 11,508,631 B2
(45) Date of Patent: Nov. 22, 2022

(54) SEMICONDUCTOR DEVICE

(71) Applicant: Taiwan Semiconductor Manufacturing Company, Ltd., Hsinchu (TW)

(72) Inventors: Yen-Chun Lin, Hsinchu (TW); Bao-Ru Young, Hsinchu County (TW); Ting-Yun Wu, Taipei (TW); Yen-Sen Wang, Hsinchu (TW); Hsiao-Wen Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 17/017,617

(22) Filed: Sep. 10, 2020

(65) Prior Publication Data

US 2021/0125883 A1 Apr. 29, 2021

Related U.S. Application Data

(60) Provisional application No. 62/927,131, filed on Oct. 29, 2019.

(51) Int. Cl.
*H01L 23/544* (2006.01)
*H01L 21/66* (2006.01)

(52) U.S. Cl.
CPC ............ *H01L 22/32* (2013.01); *H01L 23/544* (2013.01); *H01L 2223/5446* (2013.01)

(58) Field of Classification Search
CPC ................... H01L 22/32; H01L 23/544; H01L 2223/5446; H01L 22/34
See application file for complete search history.

(56) References Cited

U.S. PATENT DOCUMENTS

2015/0214125 A1* 7/2015 Tang ....................... H01L 22/32
257/48

\* cited by examiner

*Primary Examiner* — Elias Ullah
(74) *Attorney, Agent, or Firm* — JCIPRNET

(57) ABSTRACT

A semiconductor device may include function circuits and a test line structure beside the function circuits. The test line structure includes standard cell circuit blocks including a first components and environment circuit regions between the standard cell circuit blocks. The environment circuit regions include second components. The first components are different from the second components in structure, arrangement or a combination thereof.

20 Claims, 8 Drawing Sheets

SEMICONDUCTOR DEVICE

CROSS-REFERENCE TO RELATED APPLICATION

This application claims the priority benefits of U.S. provisional application Ser. No. 62/927,131, filed on Oct. 29, 2019. The entirety of the above-mentioned patent application is hereby incorporated by reference herein and made a part of this specification.

BACKGROUND

In semiconductor device manufacturing, the integrated circuits (ICs) are created on wafers of varying sizes using complicated fabrication processes with a large number of process steps. A wafer is typically formed with some testing structures together with the internal circuitry of the wafer for the purpose of performing testing on the internal circuitry of the wafer. Generally, fabricated wafers should undergo a Wafer Acceptance Test (WAT) procedure to check whether they are acceptable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
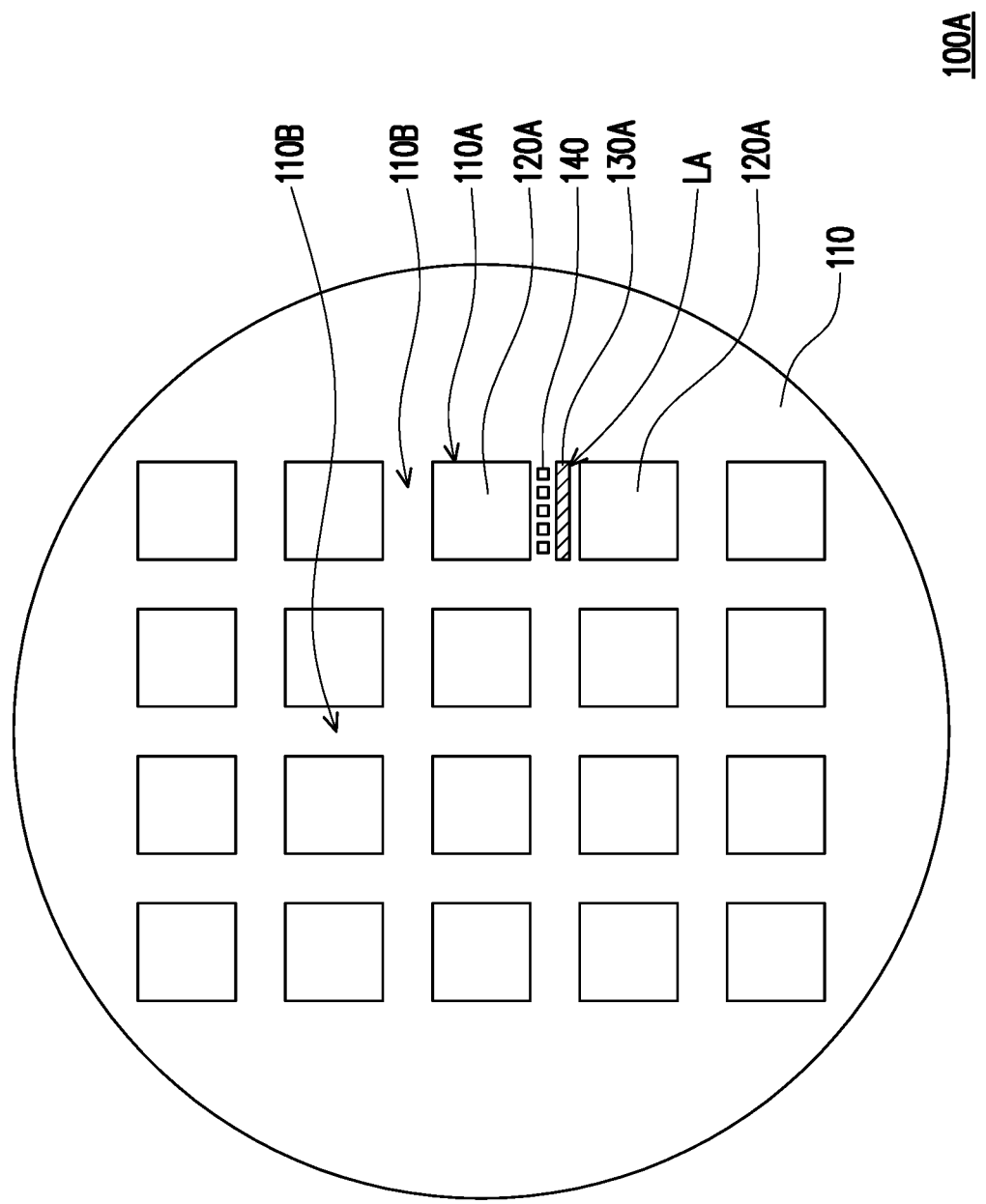
FIG. 1 schematically illustrates a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a semiconductor device in accordance with some embodiments of the disclosure. In FIG. 1, the semiconductor device may be a semiconductor wafer 100A including a base 110 having die regions 110A and scribe line regions 110B, dies 120A, a test line structure 130A and test pads 140. The dies 120A, the test line structure 130A and test pads 140 are fabricated on the base 110. In some embodiments, each of the dies 120A may include integrated circuits therein and the integrated circuits may be formed by a plurality of components connected in required connection relationship to construct the specific circuits. In some embodiments, each of the dies 120A may be sealed and surrounded by a seal ring (not shown) and located in the die regions 110A. In other words, the die regions 110A may refer to the regions where the dies 120A are. The scribe line regions 110B may be distributed in between the die regions 110A and may forms grid-like distribution in the semiconductor wafer 100A. The test line structure 130A may be disposed on a layout region LA within the scribe line regions 110B and positioned between the dies 120A. The test pads 140 may also be disposed on the scribe line regions 110B.

In some embodiments, the test line structure 130A may be formed on the semiconductor wafer 100A by using the processes and steps for forming the integrated circuits in the dies 120A. Accordingly, the test line structure 130A and the dies 120A both include multiple components such as transistors and interconnection wiring such as redistribution layers may be formed on the base 110 for connecting the components based on the required design. After the transistors and the required wirings in the dies 120A are fabricated on the semiconductor wafer 100A, a test such as a wafer acceptance test (WAT) may be performed on the test line structure 130A to determine the acceptance rate of the semiconductor wafer 100A. In some embodiments, the WAT may be performed before the dies 120A are completed so that the WAT may be an inter-metal WAT. In other words, after passing the inter-metal WAT, further fabrication processes may be performed on the semiconductor wafer 100A. In some embodiments, the WAT may be performed after the metal layer M4 or M5 (the former layers among the metal layers in the redistribution layer) is formed. On the contrary, if the inter-metal WAT is not passed, the semiconductor wafer 100A may be considered as a failure wafer and no further fabrication process is performed thereon. Accordingly, the inter-metal WAT may facilitate to inspect the failure wafer in the middle stage of the fabrication process. In the wafer acceptance test, the test line structure 130A may be electrically connected to an external circuit or probes of a probe card via the test pads 140 to check the quality of the integrated circuit process. Once the semiconductor wafer 100A passes the test, the subsequent process for fabricating the final product may be performed to form the required final product. For example, the dies 120A may be packaged and singulated by cutting the semiconductor wafer 100A along the scribe line regions 110B to obtain individual dies 120A. The cutting the semiconductor wafer 100A along the scribe line regions 110B, the singulation process, may also separate the test line structure 130A from the dies 120A so that the singulated die 120A in the final product may not include the test line structure 130A.

Figure 2:
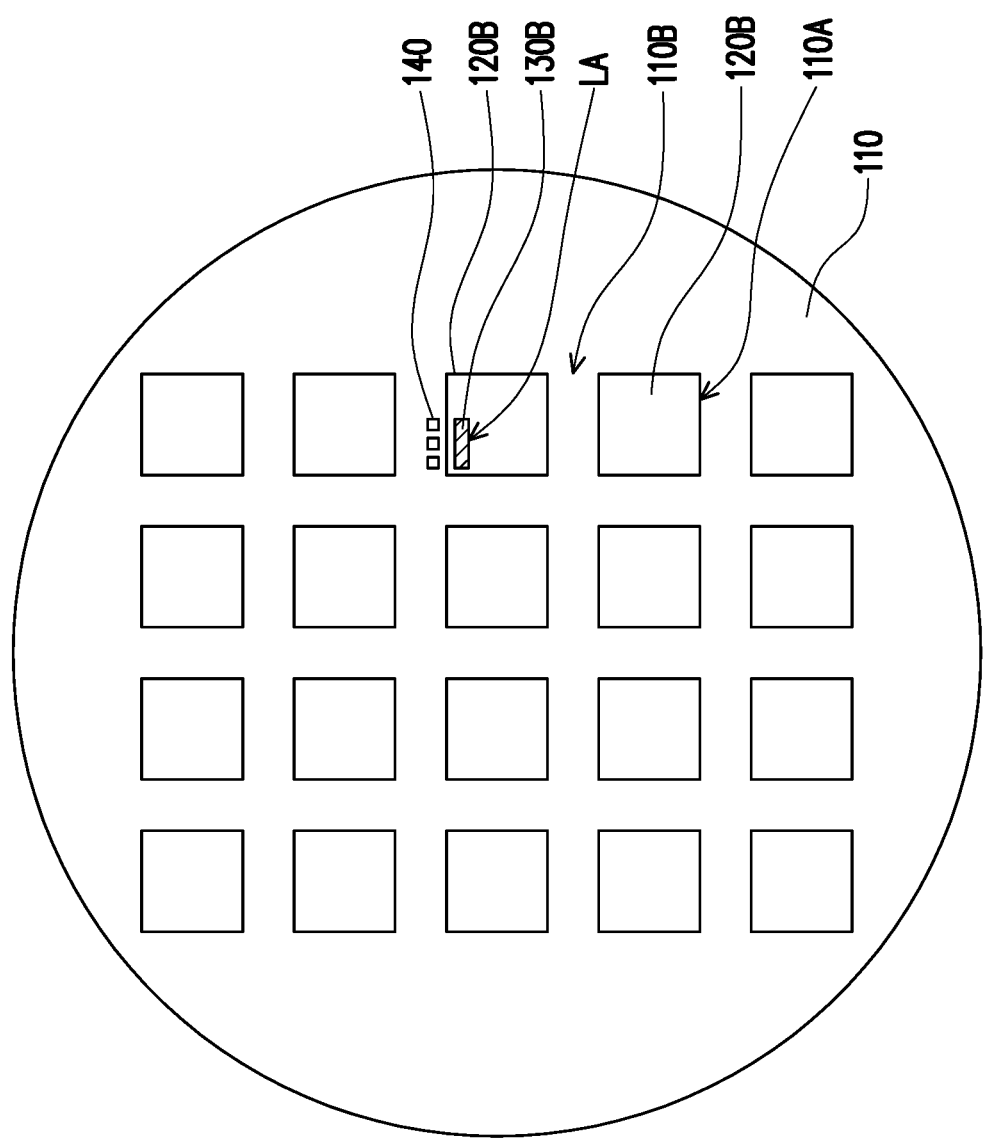
FIG. 2 schematically illustrates a semiconductor device in accordance with some embodiments.

In alternative embodiments, the test line structure may be formed within the dies so that the singulated die may include the test line structure therein. For example, FIG. 2 schematically illustrates a semiconductor device in accordance with some embodiments. The semiconductor device may be a semiconductor wafer 100B, similar to the semiconductor wafer 100A, including a base 110 having the die regions 110A separated by the scribe line regions 110B, dies 120B, a test line structure 130B and test pads 140. The dies 120B may be spaced from each other by the scribe line regions 110B and may be arranged in an array in the semiconductor wafer 100B. The dies 120B may include integrated circuits therein. The test pads 140 may be located in the scribe line regions 110B while the test line structure 130B may be disposed on a layout region LA in one of the die regions 110A. In other words, the test line structure 130B may be fabricated on one of the dies 120B. The test pads 140 may be electrically connected to the test line structure 130B via interconnection wirings in the semiconductor wafer 100B. In addition, the test line structure 130B may be electrically connected to an external circuit or probes of a probe card via the test pads 140 to check the quality of the integrated circuit process in the wafer acceptance test. In FIG. 2, the test line structure 130B may be formed within one of the dies 120B. The dies 120B singulated from the semiconductor wafer 100B may include the test line structure 130B therein and the test line structure 130B may be disconnected from the test pads 140 after the singulation of the dies 120B. The test line structure 130B within the die 120B may be a floating circuit without electrically connected to the internal function circuit in the singulated die 120B.

In some embodiments, a plurality of components, e.g. transistors, resistors, capacitors, etc. capable of constructing a required logic device such as an inverter, a NAND, a NOR, etc., may be formed in the test line structure 130A and the test line structure 130B. In some embodiments, the components formed in the test line structure 130A and the test line structure 130B may be similar to the components formed in the dies 120A and the dies 120B. For example, the distribution density, and/or the sizes of the components in the test line structure 130A and the test line structure 130B may be similar to those in the dies 120A and the dies 120B. In addition, the components in the test line structure 130A and the test line structure 130B may be formed by the same processes of forming the components in the dies 120A and the dies 120B. The performance of the components in the test line structure 130A and the test line structure 130B may thus serve as the reference for the performance of the components in the dies 120A and the dies 120B. Accordingly, the WAT performed on the test line structure 130A and the test line structure 130B may be used for monitoring the yield of the semiconductor wafer 100A and the semiconductor wafer 100B.

Figure 3:
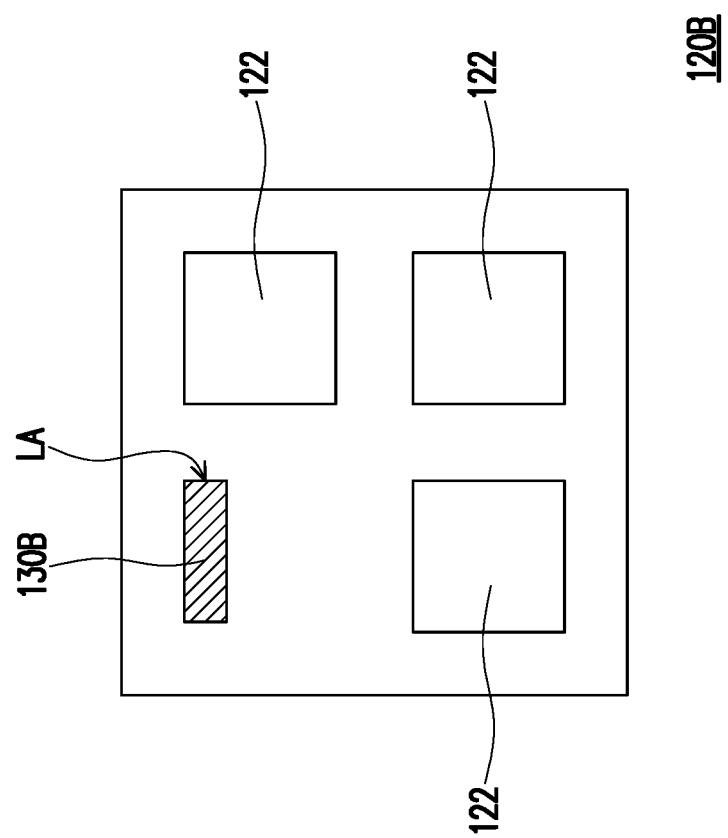
FIG. 3 schematically illustrates a semiconductor device in accordance with some embodiments.

FIG. 3 schematically illustrates a semiconductor device in accordance with some embodiments. In FIG. 3, a semiconductor device may be a die 120B cut from the semiconductor wafer 100B. The die 120B may include the test line structure 130B and function circuits 122. The function circuits 122 may include logic devices capable of processing multiple functions. In some embodiments, the die 120B may be a system on chip (SoC) and the function circuits 122 may include at least one at least one processor core, semiconductor memory blocks, external interfaces, etc. The test line structure 130B is a floating circuit in the die 120B without signally communicated with the function circuits 122. The test line structure 130B may be located in a layout region LA within the area of the die 120B and may be packaged in the same package with the function circuits 122 to remain in the final product of the semiconductor device. The layout region LA may be located beside one or more of the function circuits 122 and/or between the function circuits 122. In some alternative embodiments, the layout region LA may include multiple sub regions located between the function circuits 122 and the test line structure 130B may distribute in the multiple sub regions of the layout region LA.

Figure 4:
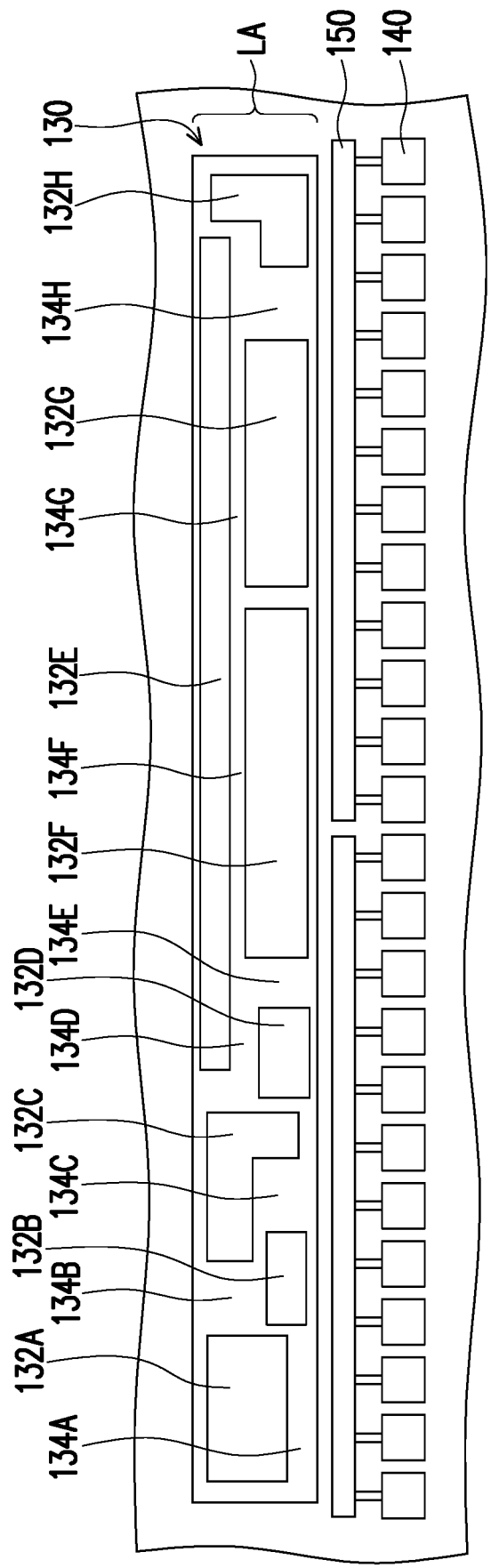
FIG. 4 schematically illustrates a test line structure in accordance with some embodiments.

FIG. 4 schematically illustrates a test line structure in accordance with some embodiments. The test line structure 130 illustrated in FIG. 4 may be an exemplarily implement example for the test line structure 130A and the test line structure 130B in the previous embodiments. The test line structure 130 may be located within the layout area LA and include standard cell circuit blocks 132 and environment circuit regions 134 located between the standard cell circuit blocks 132. The standard cell circuit blocks 132 may include standard cell circuit blocks 132A to 132H, but the disclosure is not limited thereto. The environment circuit regions 134 may include environment circuit regions 134A to 134H, but the disclosure is not limited thereto. In some embodiments, the standard cell circuit blocks 132 may include linear blocks, rectangular blocks, L-shape blocks, V-shape blocks, O-shape blocks, zigzag blocks, square blocks, or the like and may be spaced from each other by the environment circuit regions 134. The environment circuit regions 134 are located between the standard cell circuit blocks 132 and extend within the layout area LA. The components in the environment circuit regions 134 may be different from the components in the standard cell circuit blocks 132 in structure, arrangement, or a combination thereof. The components in the environment circuit regions 134 may be floating and dummy without electrically connected to other circuit structures. In some embodiments, the components in the environment regions 134 and the standard cell circuit blocks 132 may include transistors. In the standard cell circuit blocks 132, the transistors may form required logic devices capable of constructing specific function circuit.

The standard cell circuit blocks 132 in the test line structure 130 may be connected to the test pads 140 via control circuits 150. In the case the test line structure 130 is applied in the semiconductor wafer 100A, the test line structure 130, the test pads 140 and the control circuits 150 may all be fabricated on and located within the scribe line regions 110B and may all be separated from the dies 120A after the singulation process. In the case the test line structure 130 is applied in the semiconductor wafer 100B, the layout area LA may be located within the area of the die regions 110B. In other words, the test line structure 130 may be fabricated within one or more of the dies 120B while the test pads 140 and the control circuit 150 may be fabricated on the scribe line regions 110B so that the test line structure 130 may remain in the one or more of the dies 120B while the test pads 140 and the control circuit 150 may be separated from the dies 120B after the singulation process.

In some embodiments, each of the standard cell circuit blocks 132 in the test line structure 130 may include multiple components such as transistors, resistors, capacitors, etc. capable of constructing the logic devices such as inverters, NAND, Nor, or the like. The test pads 140 may include one or more power supply pads, one or more ground pads, one or more signal pads, one or more clock pads through which a power and/or signal necessary for the test is supplied to the components in the standard cell circuit blocks 132. The test pads 140 may further include one or more output pads capable of transmitting the signals output from the standard cell circuit blocks 132. During the test process, the required electric signal may be input to the test pads 140 from an external circuit or probes of a probe card and transmitted to the specified components in the standard cell circuit blocks 132 via the test pads 140 under the control of the control circuit 150. The output signals from the components in the standard cell circuit blocks 132 may be transmitted to the external circuit or probes of the probe card via the output pad of the test pads 140. The output signals may be used to determine whether the test is passed.

The components in the standard cell circuit blocks 132 may have a design the same as or similar to the components formed in the dies 120A and the dies 120B and may construct an inverter, a NAND, a NOR, or other logic devices. For example, the transistors in the standard cell circuit blocks 132 may have the channel size, the gate width, and/or the lateral gate pitch that are the same as the transistors in the dies 120A and the dies 120B. The performance of the components in the standard cell circuit blocks 132 may be similar to that of the components in the dies 120A and the dies 120B. Therefore, the test performed on the test line structure 130 may serve as a reference for determining whether the dies 120A and the dies 120B are able to operate normally. In some embodiments, the dies 120A and the dies 120B may be tested by using multiple test line structures 130. In some alternative embodiments, two or more of the dies 120A and the dies 120B may be tested by using the same test line structure 130. The numbers of the test line structures 130 may not be limited.

In the environment circuit regions 134, a plurality of components such as transistors may be included. In some embodiments, a density of the transistors in the environment circuit regions 134 may be higher than that in the standard cell circuit blocks 132. In some embodiments, the structure design of the components in the environment circuit regions 134 may be different from that in the standard cell circuit blocks 132. For example, a transistor in the environment circuit region 134 may have a gate width greater or smaller than the transistors in the standard cell circuit block 132. A gate cut structure density of the transistors in the environment circuit region 134 may be higher or lower than that in the standard cell circuit blocks 132. In addition, the transistors in the environment circuit regions 134 may form input/output (IO) devices beside the standard cell circuit blocks 132.

In the test line structure 130, the environment circuit regions 134 located between and/or beside the standard cell circuit blocks 132 have the components with different structural design from the components in the standard cell circuit blocks 132. As such, the test line structure 130 may be situated at a non-uniformed and/or non-ideal environment. In some embodiments, the performance of the components such as transistors may be sensitive to the environments. For example, the electric characteristics of the components in the standard cell circuit blocks 132 may be affected by the components in the environment circuit regions 134. Similarly, the electric characteristics of the components in the dies 120A and the dies 120B may be affected by the environment in a final product since the components in the dies 120A and the dies 120B will be situated at a non-uniformed environment in the final product. Therefore, the test result of the test line structure 130 involving the effect of the environment to the components may serve as a reference for the electric characteristics of the components in a non-uniformed environment and may more accurately reflect the real situation of the components in the dies 120A and the dies 120B, rather than merely provide a reference for determining whether the components in the dies 120A and the dies 120B are acceptable.

Figure 5:
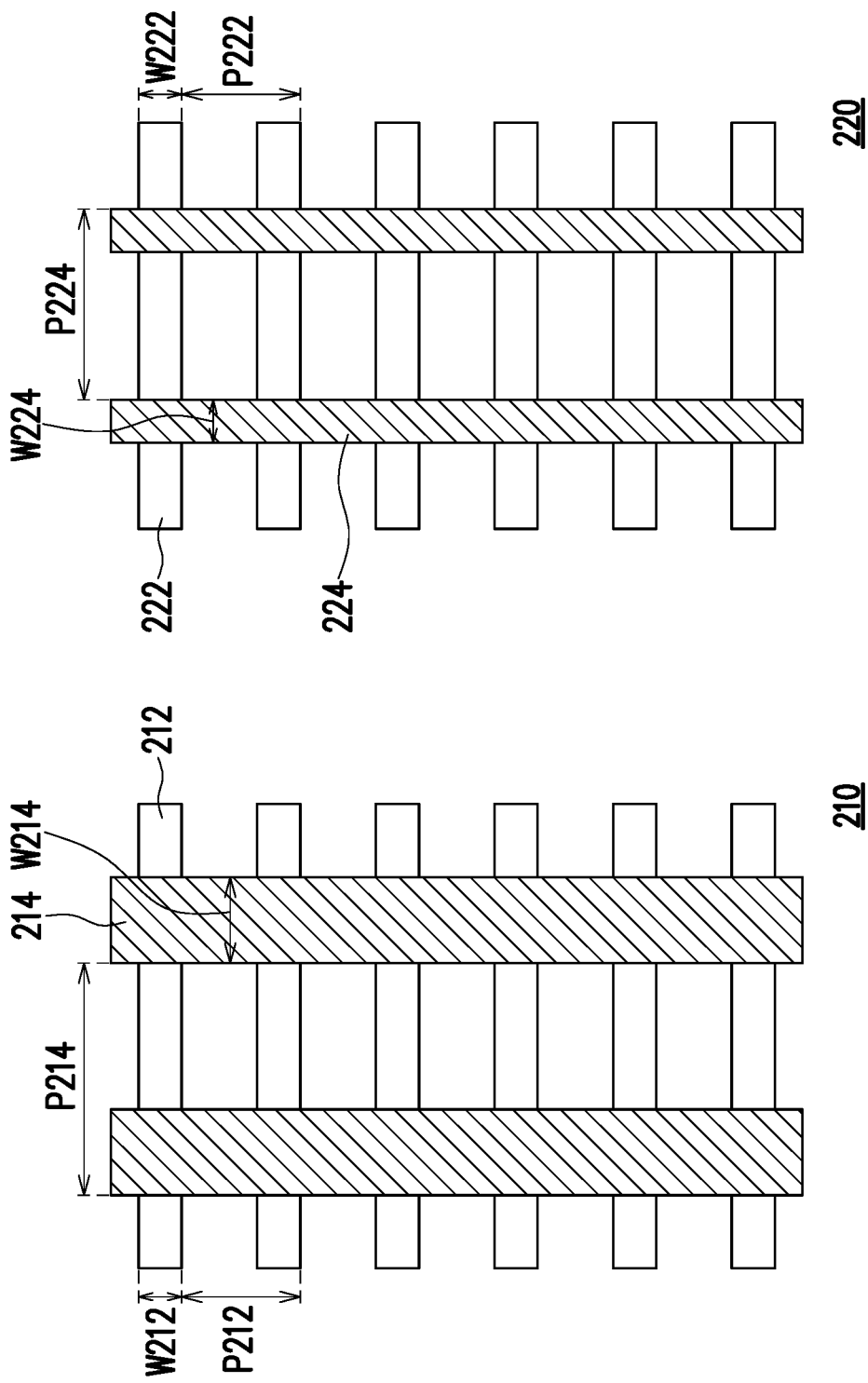
FIG. 5 schematically illustrates the components in the test line structure in accordance with some embodiments.

FIG. 5 schematically illustrates the components in the test line structure in accordance with some embodiments. Referring to FIG. 4 and FIG. 5, a component 210 may be disposed in the environment circuit regions 134 in FIG. 4 and another component 220 may be disposed in the standard cell circuit blocks 132 in FIG. 4. The component 210 in the environment circuit regions 134 may not be electrically connected to another components and serve as a dummy component in the test line structure 130. The component 220 may be connected to one or more other components in the standard cell circuit block 132 to construct the required logic device and/or function circuit. In some alternative embodiments, the component 210 may be disposed in the standard cell circuit blocks 132 and the component 220 may be disposed in the environment circuit regions 134.

The component 210 and the component 220 may be Fin-Field Effect Transistors (Fin-FETs). The component 210 may include semiconductor fins 212 and gate structures 214 and the component 220 may include semiconductor fins 222 and gate structures 224. The component 210 and the component 220 may also include sources, drains, gate insulators, spacers, etc. that are not shown in the drawing. The semiconductor fin 212 and the semiconductor fin 222 may be formed by using the same process and may be protruded structures on the substrate (not shown). In some embodiments, a width W212 of the semiconductor fin 212 may be the same or similar to a width W222 of the semiconductor fin 222 and a pitch P212 of the semiconductor fin 212 may be the same or similar to the pitch P222 of the semiconductor fin 222. Therefore, the component 210 and the component 220 may have the same fin structure design. The gate structures 214 may each extend in a direction intersecting the semiconductor fins 212 and the gate structures 224 may each extend in a direction intersecting the semiconductor fins 222. A width W214 of the gate structure 214 may be different from a width W224 of the gate structure 224. In some embodiments, the width W214 of the gate structure 214 may be greater or smaller than the width W224 of the gate structure 224. In some instances, the gate width of the component 214 may be ranged from 54 nm to 135 nm. A pitch P214 of the gate structures 214 may be the same as a pitch P224 of the gate structure 224, but in some alternative embodiments, the pitch P214 may be different with the pitch P224. In other words, the gate structure 214 of the component 210 may be different from the gate structure 224 of the component 220 in width while be the same in pitch. The "width" here may be understood as a dimension of an elongate pattern that is measured in a direction intersecting with and/or perpendicular to the elongation direction of the elongate pattern. The "pitch" here may be a distance measured from a left edge of a pattern to a left edge of another pattern, from a right edge of a pattern to a right edge of another pattern, or from a midline of a pattern to a midline of another pattern.

Figure 6:
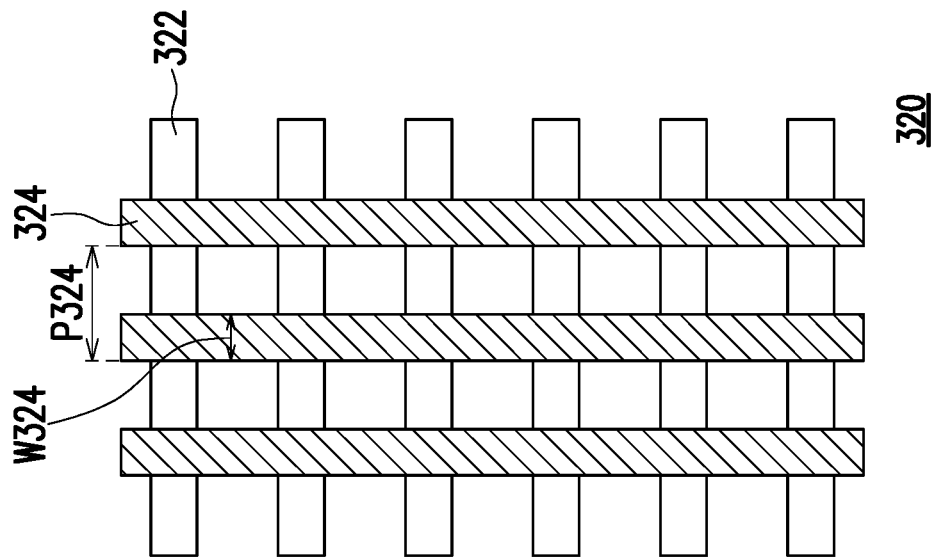
FIG. 6 schematically illustrates the components in the test line structure in accordance with some embodiments.
Figure 6:
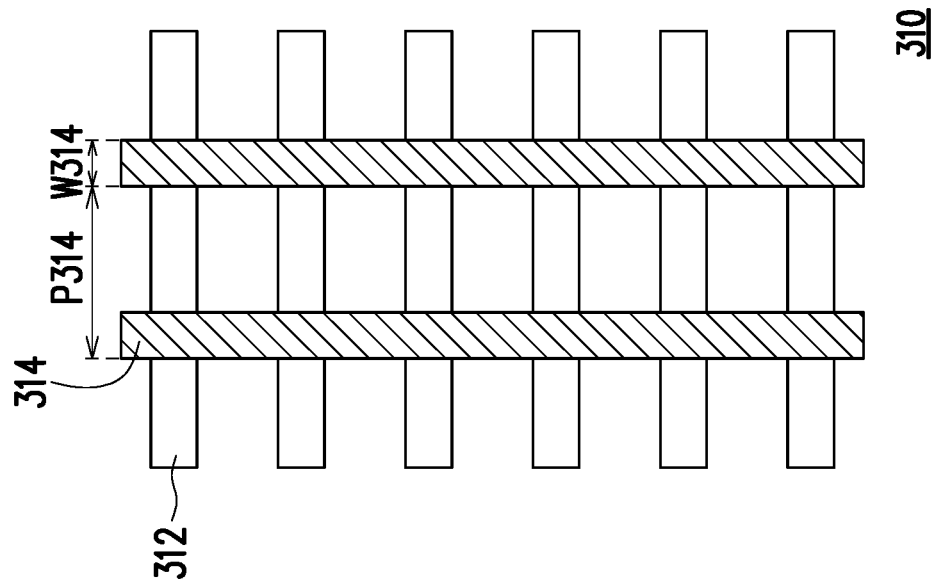

FIG. 6 schematically illustrates the components in the test line structure in accordance with some embodiments. Referring to FIG. 4 and FIG. 6, a component 310 may be disposed in the environment circuit regions 134 in FIG. 4 and another component 320 may be disposed in the standard cell circuit blocks 132 in FIG. 4. In some embodiments, the component 310 in the environment circuit regions 134 may not be electrically connected to another components and serve as a dummy component in the test line structure 130. The component 320 may be connected to one or more other components in the standard cell circuit block 132 to construct the required logic device and/or functional circuit.

In some embodiments, the component 310 and the component 320 may be Fin-Field Effect Transistors (Fin-FETs). The component 310 may include semiconductor fins 312 and gate structures 314 and the component 320 may include semiconductor fins 322 and gate structures 324. The component 310 and the component 320 may also include other parts such as sources, drains etc. that are not shown in the drawing. The semiconductor fin 312 and the semiconductor fin 322 may be formed by using the same process and may have the same width and pitch design. A width W314 of the gate structure 314 may be the same as a width W324 of the gate structure 324 while a pitch P314 of the gate structures 314 may be different from a pitch P324 of the gate structure 324. In some embodiments, the pitch P314 of the gate structures 314 may be greater than the pitch P324 of the gate structure 324, but the disclosure is not limited thereto. In other words, the gate structure 314 of the component 310 may be different from the gate structure 324 of the component 320 in pitch while the gate widths thereof are the same. In alternative embodiments, the gate structure 314 of the component 310 may be different from the gate structure 324 of the component 320 in both width and pitch.

Figure 7:
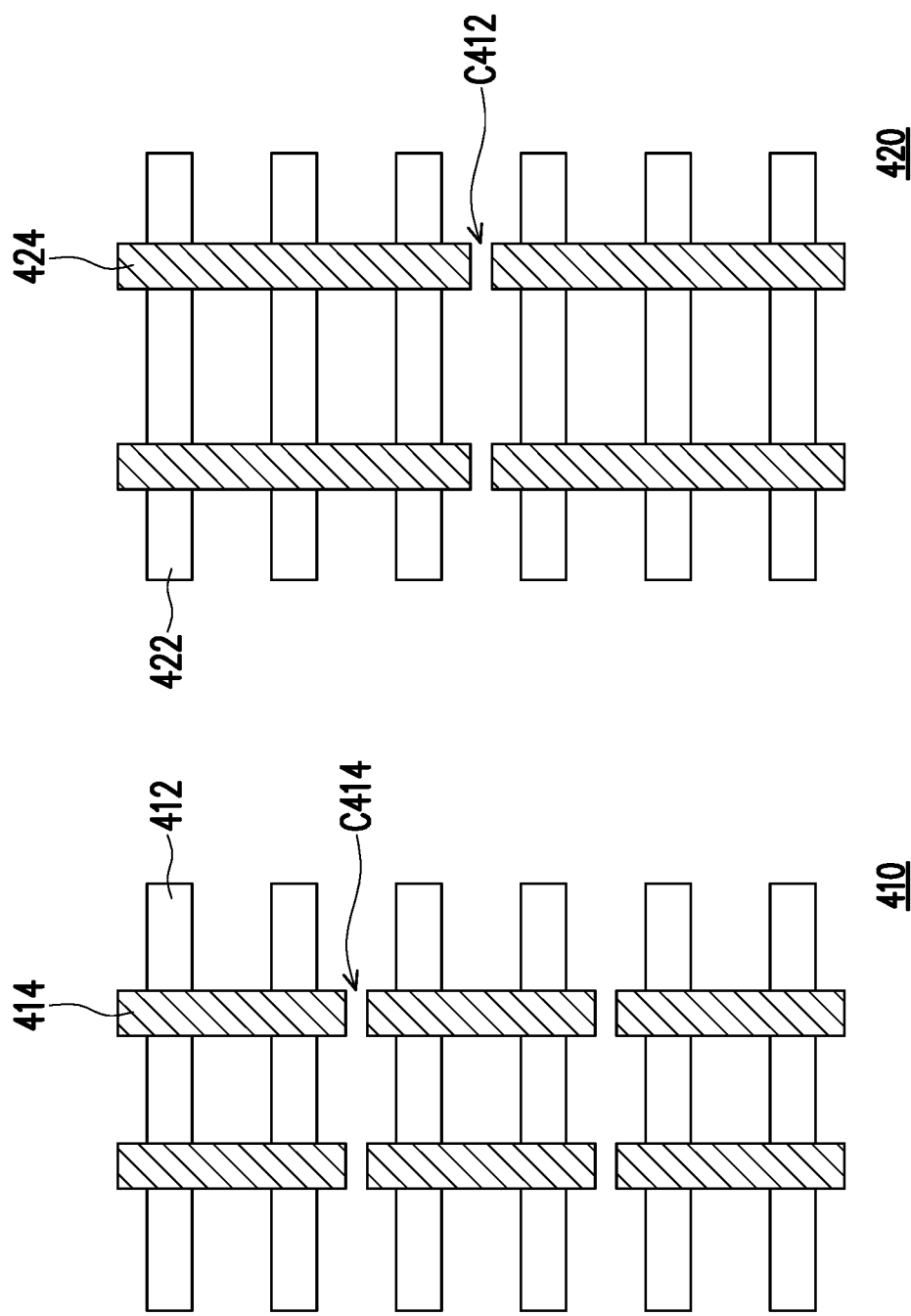
FIG. 7 schematically illustrates the components in the test line structure in accordance with some embodiments.

FIG. 7 schematically illustrates the components in the test line structure in accordance with some embodiments. Referring to FIG. 4 and FIG. 7, a component 410 may be disposed in the environment circuit regions 134 in FIG. 4 and another component 420 may be disposed in the standard cell circuit blocks 132 in FIG. 4. In some embodiments, the component 410 in the environment circuit regions 134 may not be electrically connected to another components and serve as a dummy component in the test line structure 130. The component 420 may be connected to one or more other components in the standard cell circuit block 132 to construct the required logic device and/or function circuit.

Similar to the embodiments shown in FIGS. 5 and 6, the component 410 and the component 420 may be Fin-FETs. The component 410 may include semiconductor fins 412 and gate structures 414, and the component 420 may include semiconductor fins 422 and gate structures 424. The semiconductor fins 412 and the semiconductor fins 422 may have the same or similar structural design. For example, the width and the pitch of the semiconductor fins 412 and 422 may be identical, but the disclosure is not limited thereto. The gate structures 414 may include gate cut structures C414 that divide the linear pattern of the respect gate structures 412 into sections. The gate structures 424 may include gate cut structures C424 that divide the linear pattern of the respect gate structures 422 into sections. In some embodiments, the gate cut structures C414 and the gate cut structures C424 may be formed by laser cutting the linear pattern of the gate structures 412 and 422 and may have a size less than the lithography process pitch limit, for example, 0.3 μm, but not limited thereto. The size of the gate cut structures C414 and the size of the gate cut structures C424 may be understood as the interval distance between two subsequent sections in the linear pattern of the respect gate structures 412 and 422. Accordingly, the interval distance may be smaller than the lithography process pitch limit. In some embodiments, the density of the gate cut structures C414 in the component 410 and the density of the gate cut structures C424 in the component 420 may be different. The component 410 may have a higher pitch of the gate cut structures C414 while the component 420 may have a lower pitch of the gate cut structures C424, for example.

Figure 8:
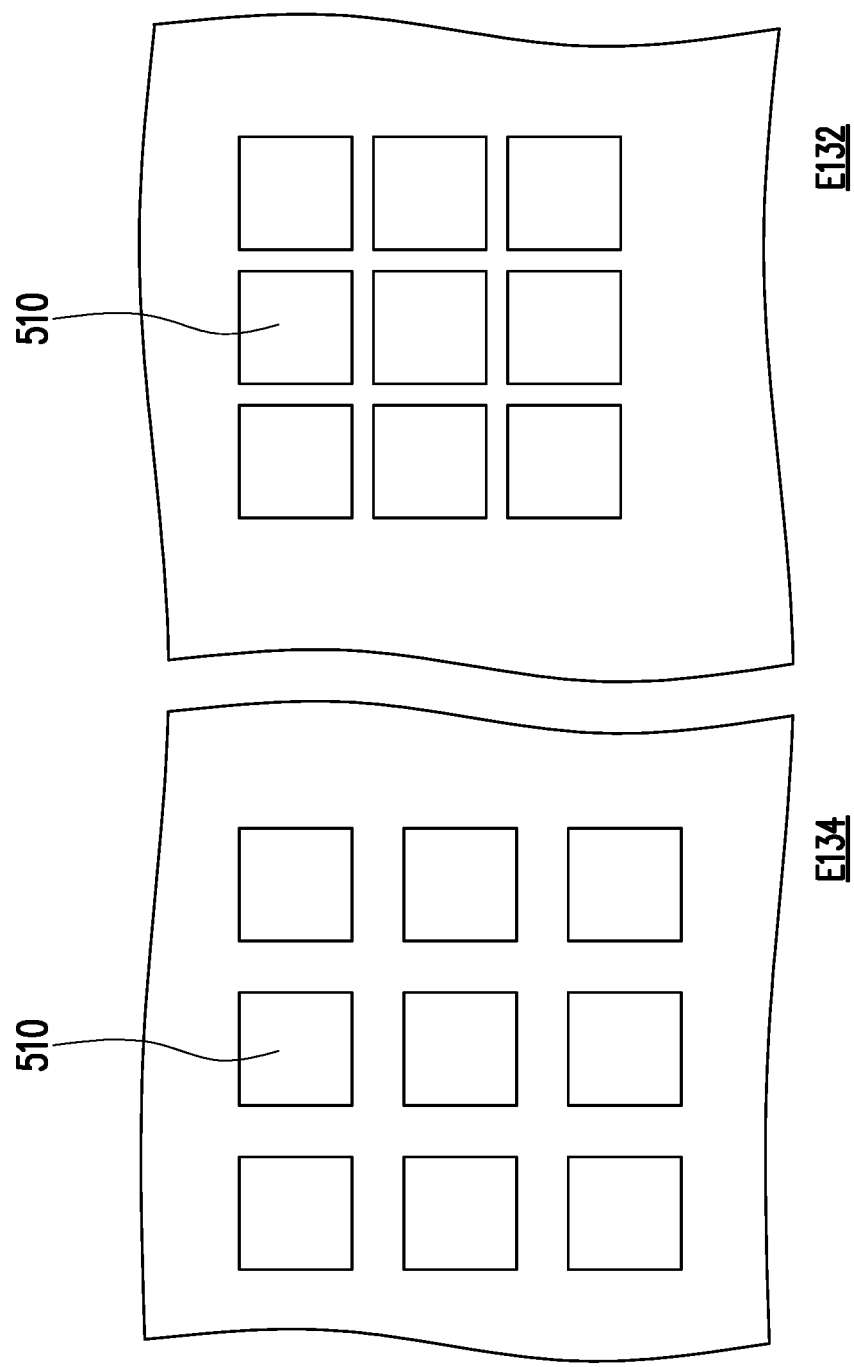
FIG. 8 schematically illustrates enlarged portions of the test line structure in accordance with some embodiments.

FIG. 8 schematically illustrates enlarged portions of the test line structure in accordance with some embodiments. Referring to FIG. 4 and FIG. 8, an enlarged portion E134 of the environment circuit regions 134 in the test line structure 130 and an enlarged portion E132 of the standard cell circuit blocks 132 in the test line structure 130 may be presented. In the enlarged portion E134, a plurality of components 510 may be included and arranged in an array. In the enlarged portion E132, a plurality of components 510 may be included and arranged in an array. The components 510 may be Fin-FETs and the Fin-FETs disposed in the enlarged portion E132 and in the enlarged portion E134 may have identical channel length, channel width, gate length and gate width. In other words, the components 510 in the enlarged portion E132 may have a same structural design and device size as the components 510 in the enlarged portion E134. As shown in FIG. 8, the distribution density of the components 510 in the enlarged portion E132 may be different from the distribution density of the components 510 in the enlarged portion E134. Accordingly, the enlarged portion E132 and the enlarged portion E134 may have different structure designs though the same components 510 are included therein. In some embodiments, the distribution density of the components 510 in the enlarged portion E134 may be lower than the distribution density of the components 510 in the enlarged portion E132. In some alternative embodiments, the distribution density of the components 510 in the enlarged portion E134 may be higher than the distribution density of the components 510 in the enlarged portion E132. In some instances, the distribution density of the components in the enlarged portion E134 may be 60% to 75%. In some embodiments, the components 510 in the enlarged portion E132 may gave a structure similar to any of the components 220, 320 and 420 and the components 520 in the enlarged portion E134 may gave a structure similar to any of the components 210, 310 and 410.

In some embodiments, one or more of the design of the components depicted in FIGS. 5 to 8 may be applicable in the test line structure 130 shown in FIG. 4 so that the environment circuit regions 134 may have a different structure design from the standard cell circuit blocks 132 to built a non-uniformed environment for the standard cell circuit blocks 132. In some embodiments, the component design in the environment circuit regions 134A to 134H may be selected from any of the embodiments shown in FIG. 5 to FIG. 8 and the following descriptions are depicted as exemplary examples.

In some embodiments, the components in the environment circuit region 134A may have a larger gate width than the components disposed in the standard cell circuit block 132A and even the standard cell circuit block 132B. For example, the structure design of the component 210 and the component 220 shown in FIG. 5 may be applicable to the environment circuit region 134A and the standard cell circuit block 132A, respectively. In some embodiments, the gate width of the component in the environment circuit region 134A may be larger than that in the standard cell circuit block 132A.

In some embodiments, the components disposed in the environment circuit region 134B may be connected to construct I/O (input/output) circuit while in the adjacent standard cell circuit blocks 132A, 132B and 132B respectively include the components constructing logic devices for achieving the required function. Therefore, the environment circuit region 134B may provide an environment different from the adjacent standard cell circuit blocks 132A, 132B and 132C.

In some embodiments, the components disposed in the environment circuit region 134C and the components disposed in the adjacent standard cell circuit blocks 132B and 132C may have different gate pitches, similar to the design of the components 310 and 320 shown in FIG. 6. For example, the components disposed in the environment circuit region 134C may have a greater gate pitch than the components disposed in the adjacent standard cell circuit blocks 132B and 132C.

In some embodiments, the components disposed in the environment circuit region 134D may have a structure different from the components disposed in the adjacent standard cell circuit blocks 132D and 132E in the gate cut structures, similar to the design of the component 410 and the component 420 shown in FIG. 7. For example, the components disposed in the environment circuit region 134D may have a greater density of the gate cut structures than the components disposed in the adjacent standard cell circuit blocks 132D and 132E.

In some embodiments, the components disposed in the environment circuit region 134E may be connected to construct I/O (input/output) circuit while in the adjacent standard cell circuit blocks 132D, 132E and 132F respectively include the components constructing logic devices for achieving the required function. Therefore, the environment circuit region 134E may provide an environment different from the adjacent standard cell circuit blocks 132D, 132E and 132F.

In some embodiments, the components disposed in the environment circuit region 134F and the components disposed in the adjacent standard cell circuit blocks 132E and 132F may have different gate pitches, similar to the design of the components 310 and 320 shown in FIG. 6. For example, the components disposed in the environment circuit region 134F may have a gate pitch greater than the components disposed in the adjacent standard cell circuit blocks 132E and 132F.

In some embodiments, the components disposed in the environment circuit region 134G and the components disposed in the adjacent standard cell circuit blocks 132E and 132G may have different distribution density, similar to the design of the enlarged portions E132 and E134 shown in FIG. 8. For example, the components disposed in the environment circuit region 134G may have a greater distribution density than the components disposed in the adjacent standard cell circuit blocks 132E and 132G.

In some embodiments, the components disposed in the environment circuit region 134H may have a structure different from the components disposed in the adjacent standard cell circuit blocks 132E, 132G and 132H in the gate cut structures, similar to the design of the component 410 and the component 420 shown in FIG. 7. For example, the components disposed in the environment circuit region 134H may have a lower density of the gate cut structures than the components disposed in the adjacent standard cell circuit blocks 132E, 132G and 132H.

In view of the above, the test line structure in the semiconductor device includes standard cell circuit blocks and environment circuit regions. The standard cell circuit blocks in the test line structure may be spaced from one another by the environment circuit regions and the components disposed in the environment circuit regions is different from the components disposed in the standard cell circuit blocks in structure, arrangement, or both. The standard cell circuit blocks may be surrounded by a non-uniform environment so that the performance of the components in the standard cell circuit blocks may be similar to the components in the final product. Accordingly, the test performed on the test line structure may have a result not only determining whether the electrical parameter (leakage current, abnormal resistance, or the like) of the component is acceptable but also reflecting the yield of the integrated circuits in the final product.

In accordance with some embodiments of the present disclosure, a semiconductor device may include a base and a test line structure disposed on the base. The test line structure may include a standard cell circuit blocks and environment circuit regions between the standard cell circuit blocks. Components in the environment circuit regions are dummy components.

In accordance with some embodiments of the present disclosure, a semiconductor device may include a base and a test line structure disposed on the base. The test line structure may include standard cell circuit blocks including a first components and environment circuit regions between the standard cell circuit blocks. The environment circuit regions includes second components. The first components are different from the second components in structure, arrangement or a combination thereof.

In accordance with some embodiments of the present disclosure, a semiconductor device may include function circuits and a test line structure beside the function circuits. The test line structure includes standard cell circuit blocks including a first components and environment circuit regions between the standard cell circuit blocks. The environment circuit regions include second components. The first components are different from the second components in structure, arrangement or a combination thereof.

In accordance with some embodiments of the present disclosure, the base includes die regions and scribe line regions between the die regions. The test line structure is disposed on the scribe line regions. The test line structure is disposed on one of the die regions. The semiconductor device further includes a function circuit disposed on the based in one of the die regions. The semiconductor device further includes test pads disposed on the base and electrically connected to the standard cell circuit blocks of the test line structure. The semiconductor device further includes a control circuit disposed between the test pads and the test line structure.

In accordance with some embodiments of the present disclosure, the first components includes first gate structures and the second component includes second gate structures, wherein the first gate structures are different from the second gate structures in width, pitch or both. The first components and the second components have a same device size but are arranged in different distribution densities. The second components are dummy. The base includes die regions and scribe line regions between the die regions. The test line structure is disposed on the scribe regions. The test line structure is disposed on one of the die regions. The semiconductor device further includes a function circuit structure disposed on the based in one of the die regions.

In accordance with some embodiments of the present disclosure, the first components includes first gate structures, the second component includes second gate structures and the first gate structures are different from the second gate structures in width, pitch or both. The first components and the second components have a same device size but are arranged in different distribution densities. The function circuits are not electrically connected to the test line structure. The second components are dummy components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a base;
   a test line structure disposed on the base and comprising:
      standard cell circuit blocks; and
      environment circuit regions disposed between the standard cell circuit blocks, wherein components in the environment circuit regions are dummy components;
   a control circuit disposed on the base; and
   test pads disposed on the base and electrically connected to the standard cell circuit blocks of the test line structure through the control circuit.

2. The semiconductor device of claim 1, wherein the base comprises die regions and scribe line regions between the die regions.

3. The semiconductor device of claim 2, wherein the test line structure is disposed on the scribe line regions.

4. The semiconductor device of claim 2, wherein the test line structure is disposed on one of the die regions.

5. The semiconductor device of claim 2, further comprising a function circuit disposed on the based in one of the die regions.

6. The semiconductor device of claim 2, wherein the test pads are disposed on the scribe line regions.

7. The semiconductor device of claim 6, wherein the control circuit is disposed on the scribe line regions.

8. A semiconductor device, comprising:
   a base; and
   a test line structure disposed on the base and comprising:
      standard cell circuit blocks comprising first components; and
      environment circuit regions disposed between the standard cell circuit blocks, and the environment circuit regions comprising second components, wherein the first components are different from the second components in structure, arrangement or a combination thereof;
   a control circuit disposed on the base; and
   test pads disposed on the base and electrically connected to the standard cell circuit blocks of the test line structure through the control circuit.

9. The semiconductor device of claim 8, wherein the first components comprise first gate structures, the second components comprise second gate structures and the first gate structures are different from the second gate structures in width, pitch or both.

10. The semiconductor device of claim 8, wherein the first components and the second components have a same device size but are arranged in different distribution densities.

11. The semiconductor device of claim 8, wherein the second components are dummy.

12. The semiconductor device of claim 8, wherein the base comprises die regions and scribe line regions between the die regions.

13. The semiconductor device of claim 12, wherein the test line structure is disposed on the scribe regions.

14. The semiconductor device of claim 12, wherein the test line structure is disposed on one of the die regions.

15. The semiconductor device of claim 12, further comprising a function circuit structure disposed on the based in one of the die regions.

16. A semiconductor device, comprising:
   function circuits; and
   a test line structure beside the function circuits and comprising:
      standard cell circuit blocks comprising first components; and
      environment circuit regions disposed between the standard cell circuit blocks, and the environment circuit regions comprising second components, wherein the first components are different from the second components in structure, arrangement or a combination thereof;
   a control circuit disposed on the base; and
   test pads disposed on the base and electrically connected to the standard cell circuit blocks of the test line structure through the control circuit.

17. The semiconductor device of claim 16, wherein the first components comprise first gate structures, the second components comprise second gate structures and the first gate structures are different from the second gate structures in width, pitch or both.

18. The semiconductor device of claim 16, wherein the first components and the second components have a same device size but are arranged in different distribution densities.

19. The semiconductor device of claim 16, wherein the function circuits are not electrically connected to the test line structure.

20. The semiconductor device of claim 16, wherein the second components are dummy components.

* * * * *